(12) United States Patent
Korman

(10) Patent No.: US 8,049,097 B2
(45) Date of Patent: Nov. 1, 2011

(54) SOLAR CELL INCLUDING COOLING CHANNELS AND METHOD FOR FABRICATION

(75) Inventor: Charles Steven Korman, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 470 days.

(21) Appl. No.: 12/189,221

(22) Filed: Aug. 11, 2008

(65) Prior Publication Data

US 2010/0032003 A1    Feb. 11, 2010

(51) Int. Cl.
*H01L 31/042* (2006.01)
(52) U.S. Cl. ........................ 136/246; 136/259
(58) Field of Classification Search .............. 136/246
See application file for complete search history.

(56) References Cited

U.S. PATENT DOCUMENTS

| | | | |
|---|---|---|---|
| 4,193,081 A | 3/1980 | Kaplow et al. | |
| 4,209,347 A | 6/1980 | Klein | |
| 4,361,717 A | 11/1982 | Gilmore et al. | |
| 5,336,335 A | 8/1994 | Hall et al. | |
| RE36,156 E | 3/1999 | Hall et al. | |
| 6,005,185 A | 12/1999 | Tange | |
| 6,111,191 A | 8/2000 | Hall et al. | |
| 6,172,297 B1 | 1/2001 | Hezel et al. | |
| 6,207,891 B1 | 3/2001 | Hall et al. | |
| 6,210,991 B1* | 4/2001 | Wenham et al. | 438/97 |
| 6,406,163 B1 | 6/2002 | Yang | |
| 2002/0074034 A1 | 6/2002 | Fujisaki et al. | |
| 2003/0179548 A1* | 9/2003 | Becker et al. | 361/704 |
| 2004/0261839 A1* | 12/2004 | Gee et al. | 136/256 |
| 2006/0162762 A1 | 7/2006 | Gilman | |
| 2006/0196535 A1* | 9/2006 | Swanson et al. | 136/244 |
| 2007/0029642 A1 | 2/2007 | Inagawa et al. | |
| 2007/0186971 A1* | 8/2007 | Lochun et al. | 136/256 |

FOREIGN PATENT DOCUMENTS

EP    0789405 A2    8/1997

OTHER PUBLICATIONS

R. Hezel and W. Hoffmann; "A New Generation of Industnal Crystalline Silicon Solar Cells Based on the OECO Technology"; 3rd World Conference on Photovoltaic Energy Conversion May 11-18, 2003 Osaka, Japan; vol. 2, pp. 1399-1402 (4 Pages).

Ralf Jonczyk et al.; "Solar Cell Design for Manufacturing"; Proceedings from DOE Solar Energy Technologies Program Review Meeting in Apr. 2007. (2 Pages).

* cited by examiner

*Primary Examiner* — Alexa Neckel
*Assistant Examiner* — Miriam Berdichevsky
(74) *Attorney, Agent, or Firm* — Ann M. Agosti

(57) ABSTRACT

The solar cell comprises a front side comprising a first doped layer, a backside comprising formations defining channels therebetween, the backside further comprising a second doped layer situated on at least some of the surfaces of the channels facing the front side, and an electrically conductive layer situated on at least some surfaces of the channels facing the front side. The first and second doped layers comprise opposite polarity types.

20 Claims, 4 Drawing Sheets

US 8,049,097 B2

SOLAR CELL INCLUDING COOLING CHANNELS AND METHOD FOR FABRICATION

BACKGROUND

The subject matter disclosed herein relates generally to solar cells.

Fabrication costs associated with molded wafer solar cells are generally less than fabrication costs associated with cast wafer solar cells. However, the molded wafer cells are typically somewhat less efficient and much thicker, for example on the order of 600 microns, than cast wafer cells.

Because the generated photocurrent has to be conducted through the entire wafer, a reduced open circuit voltage occurs in molded wafer solar cells. Under normal operating conditions, the open circuit voltage is also impacted by the temperature rise of the molded silicon wafer solar cells. Cooling of any solar cell, whether molded or cast for example, that is packaged in a conventional module is a challenge because the cells are laminated in a package using materials that act as thermal insulators.

Therefore, it would be desirable to provide improved cooling in solar cells generally and more particularly to prevent reduced open circuit voltage in molded wafer solar cells.

BRIEF DESCRIPTION

In accordance with one embodiment disclosed herein, a solar cell comprises a front side comprising a first doped layer, a backside comprising formations defining channels therebetween, the backside further comprising a second doped layer situated on at least some of the surfaces of the channels facing the front side, and an electrically conductive layer situated on at least some surfaces of the channels facing the front side. The first and second doped layers comprise opposite polarity types.

In accordance with another embodiment disclosed herein, a solar energy conversion system comprises an array of molded wafer solar cells. Solar cells in the array comprise a front side comprising a first doped layer, a backside comprising formations defining channels therebetween, the backside further comprising a second doped layer situated on at least some of the surfaces of the channels facing the front side, and an electrically conductive layer situated on at least some surfaces of the channels facing the front side. The first and second doped layers comprise opposite polarity types.

In accordance with another embodiment disclosed herein, a method of fabricating a solar cell comprises forming a plurality of channels in a backside of the solar cell so as to reduce the effective electrical thickness of the solar cell, providing a first doped layer on a front side of the solar cell, providing a second doped layer on at least some of the surfaces of the channels facing the front side, and providing an electrically conductive layer on at least some surfaces of the channels facing the front side. The first and second doped layers comprise opposite polarity types.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Embodiments disclosed herein include solar cells including cooling channels and methods for fabricating the same. As used herein, singular forms such as "a," "an," and "the" include plural referents unless the context clearly dictates otherwise.

Figure 1:
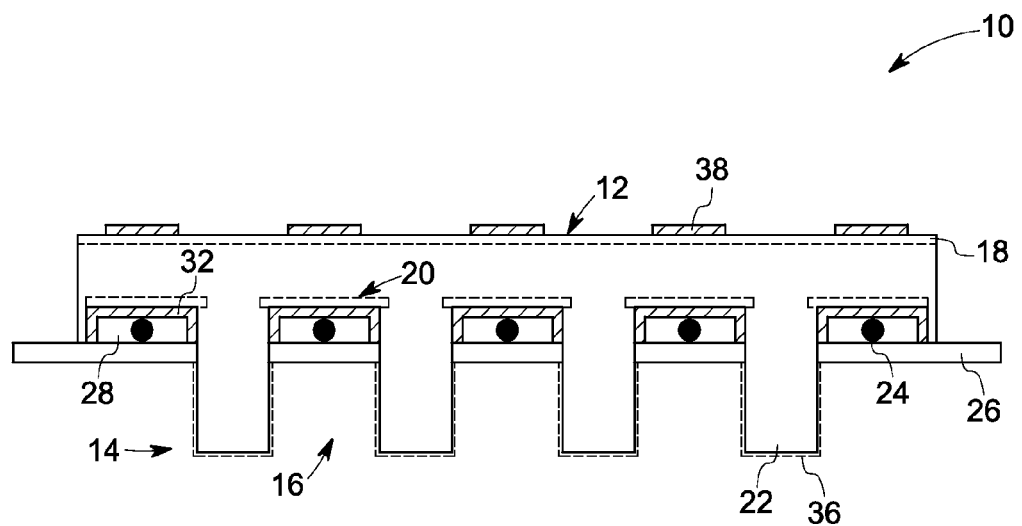
FIG. 1 illustrates a solar cell in accordance with aspects disclosed herein.
Figure 2:
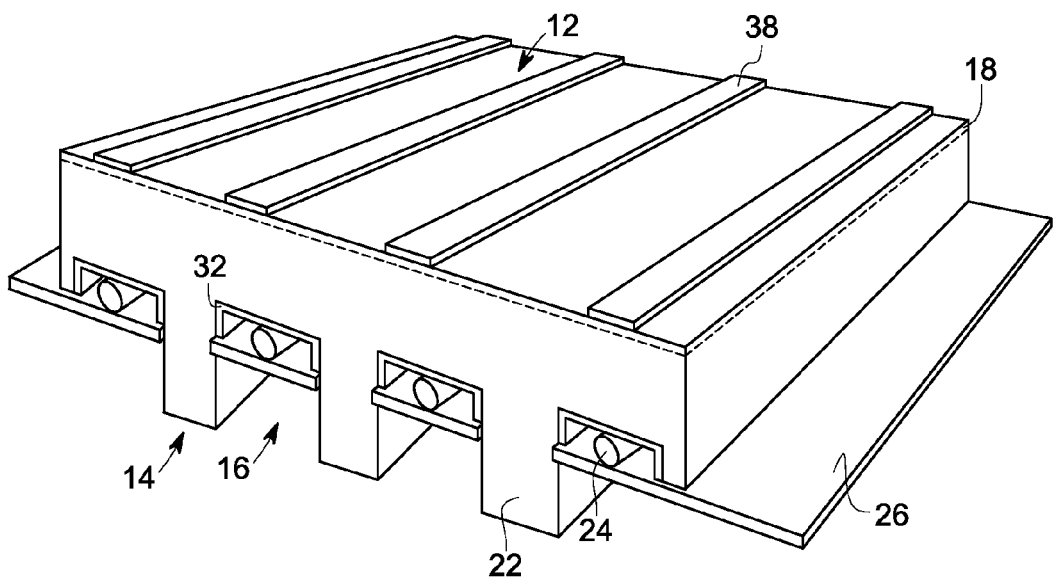
FIG. 2 illustrates a perspective view the solar cell of FIG. 1.

Referring to FIGS. 1 and 2, in one embodiment, a solar cell 10 comprises a front side 12, a backside 14, and an electrically conductive layer 32. Backside 14 comprises formations 22 that project from front side 12 to define channels 16 between them. Formations 22 provide structural support for solar cell 10, and channels 16 are configured to act as cooling passages for solar cell 10.

In one embodiment, solar cell 10 comprises a molded wafer solar cell. Channels 16 may be formed by any appropriate process such as, for example, etching or mechanical grinding. The depth of a channel, the width of a channel, and the width of a formation are process variables. A narrow formation enables efficient collection, but makes the solar cell fragile and difficult to fabricate. A wider formation requires carriers to travel longer distances. Therefore, in one embodiment, formations 22 are made thick enough to provide structural support for solar cell 10 while maintaining the aspect ratio (depth to width ratio) of the channels close to 1.

Front side 12 comprises a first doped layer 18. Backside 14 comprises a second doped layer 20 situated on at least some of the surfaces of channels 16 facing front side 12. First doped layer 18 and second doped layer 20 are of opposite polarities. In one embodiment, solar cell 10 comprises a p type solar cell, first doped layer 18 comprises an n+ layer, and second doped layer 20 comprises a p+ layer.

Electrically conductive layer 32 is formed on the surfaces of channels 16 that face the front side. In one embodiment, a borosilicate glass (not shown) is first deposited over the backside 14 and then densified to drive in an excess of Boron to provide a p+ layer (second doped layer 20). In one embodiment, all of the oxide in the borosilicate glass is removed by wet etching after the borosilicate glass is deposited over the backside 14 and densified to drive in an excess of Boron to provide a p+ layer. A metal is printed into the channels to form the electrically conductive layer 32. If desired, portions of the electrically conductive layer 32 may partially extend along the sidewalls of the channel as shown in FIG. 1 by printing the metal accordingly. In one embodiment, the printed metal comprises Aluminum, which can also serve as the p+ dopant. A thin coating 36 can be applied to the formations for electrically isolating the formations. This coating can be spray coated after a passivation material 28 is applied. Additionally, another electrically conductive layer 38 may be patterned on front side 12.

When electrically conductive layers 32 are provided in channels 16 as shown, the effective electrical thickness of solar cell 10 is reduced. In an exemplary embodiment, for a 400 micron molded wafer solar cell, channels 16 can be made to a depth of 200 microns. The thickness from front side 12 to the channel surfaces facing the front side, i.e. the effective electrical thickness of the molded wafer solar cell 10, will be 200 microns, which matches the effective electrical thickness of a typical cast wafer solar cell. Also, the upper 200 microns of a molded wafer cell typically has the best material quality. Therefore, both the higher quality and the lower total electrical resistance are expected for solar cell 10.

Solar cell 10 may further comprise electrically conductive elements 24 and a seal for protecting the electrically conductive elements 24 and the electrically conductive layer 32. In one embodiment, the seal provides passivation to the backside of the solar cell while leaving formations 22 exposed. The electrically conductive elements 24 are electrically coupled to the electrically conductive layer 32 by any appropriate attachment technique with several examples including soldering, brazing, and using conductive epoxy. In one embodiment, the seal comprises a passivation material 28, such as a polyamide or a fluoropolymer resin material that also serves as a moisture barrier, covering the electrically conductive elements 24 and the electrically conductive layer 32. Passivation materials can be applied by methods such as spraying or spin coating. The material will settle into the channels depending on its viscosity, and the coating process used will determine the thickness of the material. This material can then be cured to form a hard seal.

In another embodiment, the seal further comprises a back sheet 26 to cover electrically conductive elements 24 and layer 32. Several materials, common in the photovoltaic industry for producing laminates, can be used such as ethylene-vinyl acetate (EVA) that comes in sheet form and DUPONT® TPT™ material that consists of a sandwich of mylar polyester films between two layers of DUPONT® TEDLAR® film which acts as a good moisture barrier. Typically, the TPT™ film is coated with EVA that serves as a glue layer that softens and adheres when heated. In this case the films would be stenciled to conform to the channel structure.

Figure 3:
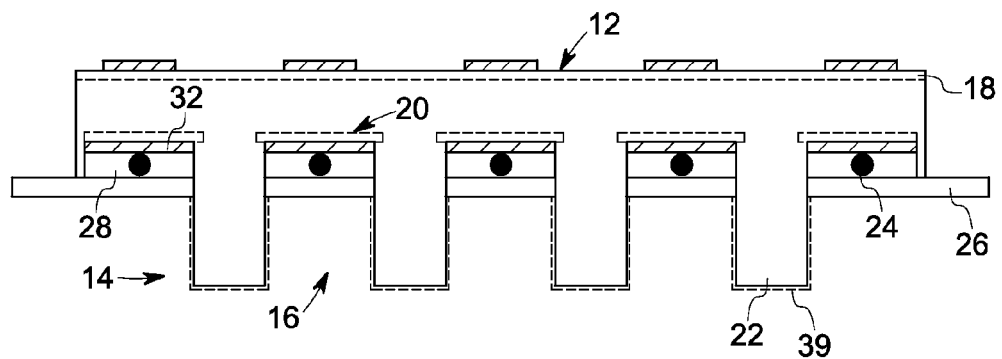
FIG. 3 illustrates another solar cell in accordance with aspects disclosed herein.

In another embodiment shown in FIG. 3, a laser is used to selectively remove a passivating oxide 39 and metal is printed into the channels to form the electrically conductive layer 32. More specifically, the passivating oxide 39 is removed only from the side parallel to front side 12, and then the metal is printed to the side parallel to front side 12. Therefore, the sidewalls of formations 22 may remain covered with the passivating oxide to help in electrically insulating formations 22.

Figure 4:
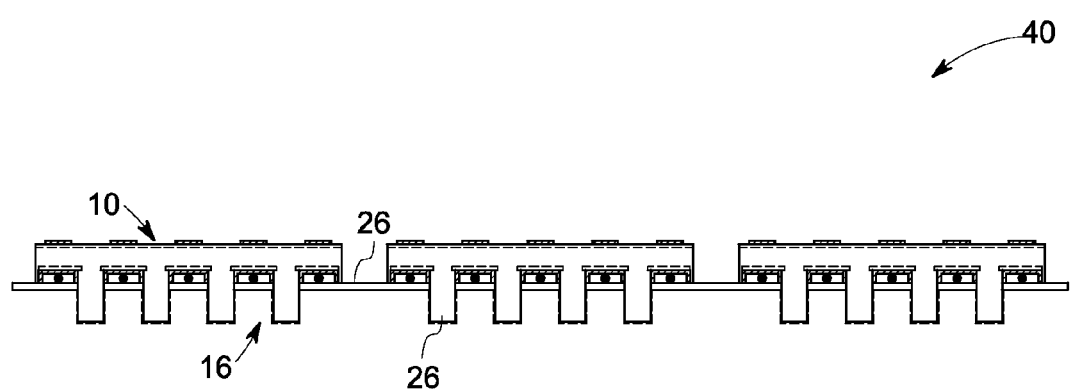
FIG. 4 illustrates a solar cell array in accordance with aspects disclosed herein.

In one embodiment, the electrically conductive elements 24 comprise metal wires. Prior to sealing, in one embodiment, the metal wires are coupled to the electrically conductive layer 32. In another embodiment, the metal wires are coupled to the back sheet 26 in advance so that the backsheet and metal wires can be positioned in the module in a single step. The wire can be pre-tinned with solder to facilitate attachment. In an array embodiment 40 as shown in FIG. 4, the back sheet 26 can be configured to simultaneously cover backsides of a number of cells to facilitate alignment of multiple solar cells 10. In one embodiment, the back sheet 26 can extend beyond the array of the solar cells 10 and can further be coupled to a frame (not shown). To connect solar cells in series, an electrically conductive layer 38 on front side 12 of one solar cell may be connected to an electrically conductive layer 32 on backside 14 of another solar cell. In one embodiment (not shown), a metal harness can be configured so that the wires are attached to a metal tab, and a tab from the top of one cell can then be connected (soldered) to a tab at the bottom of an adjacent cell.

Figure 5:
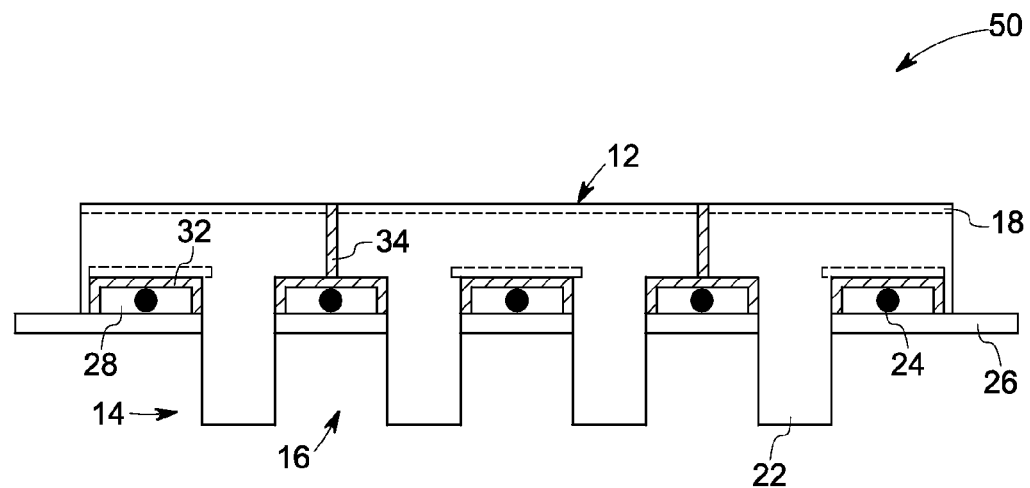
FIG. 5 illustrates another solar cell in accordance with aspects disclosed herein.
Figure 6:
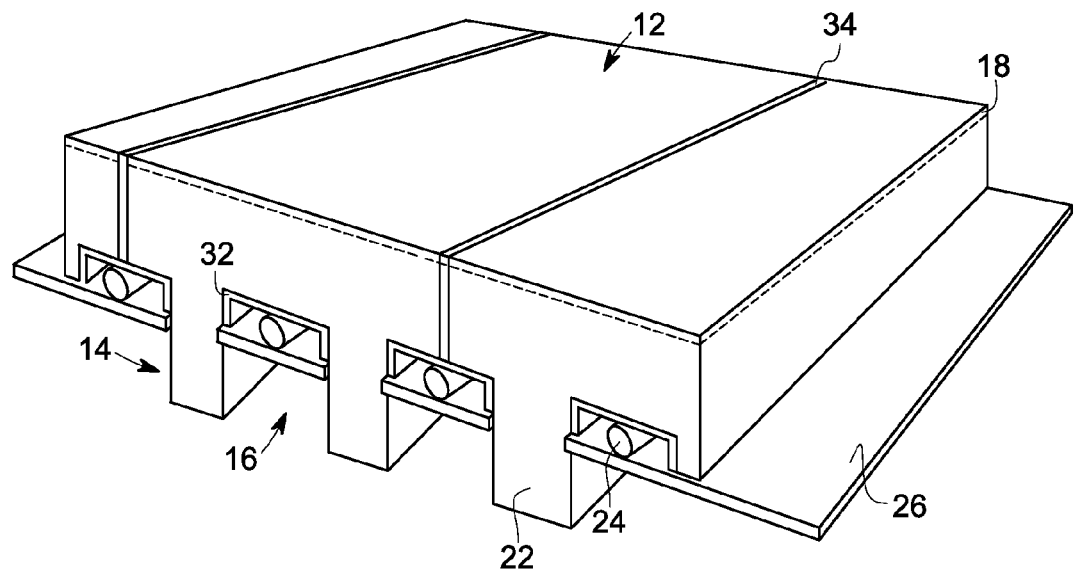
FIG. 6 illustrates a perspective view of the solar cell of FIG. 5.

In the embodiment of FIGS. 5-6, solar cell 50 is one in which second doped layer 20 is not provided in all channels 16. In one such exemplary embodiment, second doped layer 20 is provided in alternate channels 16, and electrically conductive layer 32 is formed in both types of such channels. Solar cell 50 is provided with electrically conductive vias 34 from front side 12 to each channel without the second doped layer. Providing the second doped layer in alternate channels is only one exemplary embodiment. Second doped layer 20 can be provided in the channels in any order leaving the second doped layer off at least some of the channels. For example, in one embodiment (not shown), one out of every ten consecutive channels is not provided with the second doped layer 20. Alternating channels may be used to provide all of the contacts onto the bottom side of the cell and thus eliminate the need to have a front to back tabbing configuration to provide an electrical series interconnection. If alternating series of parallel wires are used to provide opposite polarity connections, then each polarity can be routed to a different side of the cell.

Figure 7:
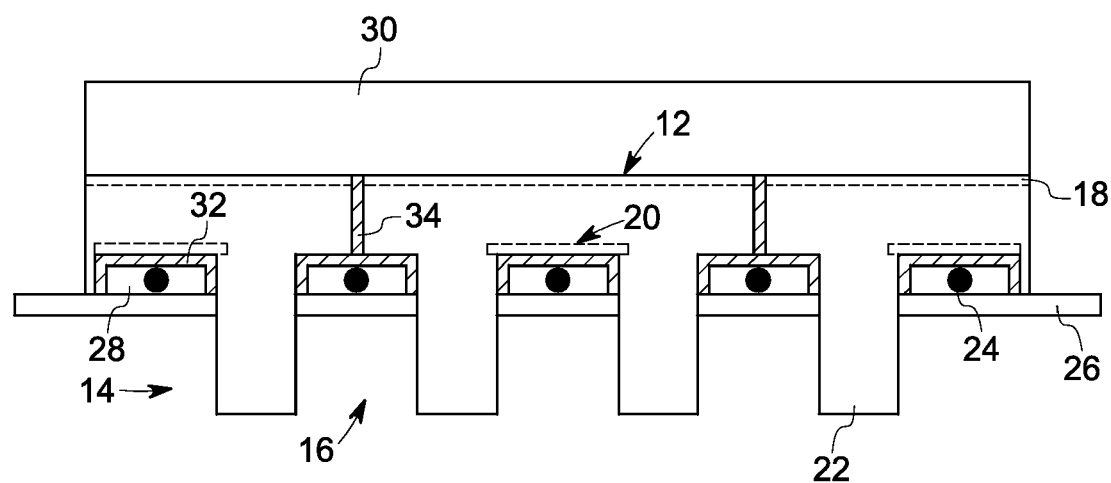
FIG. 7 illustrates an encapsulated solar cell in accordance with aspects disclosed herein.

FIG. 7 illustrates an encapsulated solar cell 50. A transparent cover 30 may be provided over front side 12 of solar cell 50. Solar cell 50 may be encapsulated so as to leave formations 22 exposed using a lamination process. The transparent cover 30 and the back sheet 26 provide passivation. The transparent cover may comprise glass be coated to provide anti-reflection characteristics, tailor spectral reflection, and/or provide self-cleaning characteristics.

The solar cells are arranged in an array such that the channels 16 of all the solar cells form an array of cooling passages. The electrically conductive elements 24 may used to connect the solar cells in the array. The cooling passages allow air to pass through, enabling cooling of the solar cell or an array of the solar cells through natural convection. The exposed formations 22 increase the surface area of the solar cell to facilitate fast cooling. A screen (not shown) can be used around the sides of the solar cell or an array of the solar cells to prevent debris from entering the cooling passages while allowing air to pass through. In another embodiment (not shown), air or a coolant liquid can be forced through the cooling passages to cool the solar cells.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A solar cell, comprising:
   a front side comprising a first doped layer;
   a backside comprising formations defining channels therebetween, the backside further comprising a second doped layer situated on at least some but not all of the surfaces of the channels facing the front side, wherein the first and second doped layers comprise opposite polarity types;
   an electrically conductive layer situated on at least some surfaces of the channels facing the front side; and
   a back sheet through which the formations extend.

2. The solar cell of claim 1, wherein the solar cell comprises a molded wafer solar cell.

3. The solar cell of claim 1, wherein the channels are configured to act as cooling passages.

4. The solar cell of claim 1, wherein the solar cell comprises a p type solar cell, the first doped layer comprises an n+ layer, and the second doped layer comprises a p+ layer.

5. The solar cell of claim 1, further comprising electrically conductive elements electrically coupled to the electrically conductive layer.

6. The solar cell of claim 1, further comprising a seal configured for protecting the electrically conductive elements and layer.

7. The solar cell of claim 6, wherein the seal comprises a passivation material covering the electrically conductive elements and layer.

8. The solar cell of claim 1, wherein the back sheet comprises ethylene-vinyl acetate or mylar polyester film.

9. The solar cell of claim 6, wherein the electrically conductive elements comprise metal wires.

10. The solar cell of claim 1, further comprising a glass cover configured for providing anti-reflection and passivation for the front side.

11. The solar cell of claim 1, wherein the formations provide structural support for the solar cell and the aspect ratio of the channels is substantially 1.

12. A solar energy conversion system, comprising:
an array of molded wafer solar cells, each of the solar cells comprising:
a front side comprising a first doped layer,
a backside comprising formations defining channels therebetween, the backside further comprising a second doped layer situated on at least some but not all of the surfaces of the channels facing the front side, wherein the first and second doped layers comprise opposite polarity types,
an electrically conductive layer situated on at least some surfaces of the channels facing the front side, and
a back sheet through which the formations extend.

13. A method of fabricating a solar cell, comprising:
forming a plurality of channels between formations in a backside of a solar cell so as to reduce the effective electrical thickness of the solar cell;
providing a first doped layer on a front side of the solar cell;
providing a second doped layer on at least some but not all of the surfaces of the channels facing the front side, wherein the first and second doped layers are of opposite polarity;
providing an electrically conductive layer on at least some surfaces of the channels facing the front side; and
providing a back sheet through which the formations extend.

14. The method of claim 13, wherein the solar cell comprises a molded wafer solar cell.

15. The method of claim 13, further comprising:
providing an electrically conductive element in each of the plurality of channels, and
passivating the backside.

16. The method of claim 15, wherein passivating the backside comprises sealing the electrically conductive elements and layer.

17. The method of claim 16, wherein sealing comprises applying a passivation material covering the electrically conductive elements and layer.

18. The method of claim 13, wherein said providing a back sheet comprises providing a sheet of ethylene-vinyl acetate or mylar polyester film.

19. The method of claim 16, further comprising providing a glass cover with anti-reflection and passivation over the front side.

20. The method of claim 13, further comprising providing electrically conductive vias from the front side to at least some of the channels without the second doped layer.

* * * * *